(12) United States Patent
Wang et al.

(10) Patent No.: US 9,124,267 B2
(45) Date of Patent: Sep. 1, 2015

(54) DIGITAL TRANSMITTER AND METHOD FOR CALIBRATING DIGITAL TRANSMITTER

(71) Applicant: MEDIATEK INC., Hsin-Chu (TW)

(72) Inventors: Wen-Chieh Wang, Tainan (TW); Chi-Hsueh Wang, Kaohsiung (TW); Hsiang-Hui Chang, Miaoli County (TW); I-Wen Liu, Kaohsiung (TW); Khurram Muhammad, Winston-Salem, NC (US); Chih-Ming Hung, Mckinney, TX (US)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/281,902

(22) Filed: May 20, 2014

(65) Prior Publication Data
US 2014/0348264 A1    Nov. 27, 2014

Related U.S. Application Data

(60) Provisional application No. 61/825,630, filed on May 21, 2013.

(51) Int. Cl.

| | |
|---|---|
| *H04L 27/00* | (2006.01) |
| *H03K 19/0175* | (2006.01) |
| *H03F 3/217* | (2006.01) |
| *H04L 27/34* | (2006.01) |
| *H04B 1/04* | (2006.01) |
| *H04W 24/02* | (2009.01) |
| *H04L 25/02* | (2006.01) |
| *H04L 25/08* | (2006.01) |
| *H03M 1/12* | (2006.01) |

(Continued)

(52) U.S. Cl.
CPC ........ *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC ........... H04L 5/00; H04L 15/00; H04L 17/00; H04L 27/367; H04B 1/00; H04B 3/00; H04B 5/00; H04B 7/00; H04B 10/00; H04B 13/00; H04B 14/00; H04B 15/00; H03F 1/3241
USPC ................ 375/294–295, 215, 307, 375, 376
See application file for complete search history.

(56) References Cited

U.S. PATENT DOCUMENTS 5,935,257 A * 8/1999 Nishimura ..................... 713/503
6,239,720 B1 * 5/2001 Kim et al. ...................... 340/5.1

(Continued)

*Primary Examiner* — Emmanuel Bayard
(74) *Attorney, Agent, or Firm* — Winston Hsu; Scott Margo

(57) ABSTRACT

A digital transmitter includes: a plurality of adjustable delay lines arranged to delay a plurality of digital input signals by a plurality of delay times to generate a plurality of delayed digital input signals respectively; a plurality of converting devices arranged to convert the plurality of delayed digital input signals into a plurality of converting signals respectively; and a calibration device arranged to adjust a delay time of at least one adjustable delay line in the plurality of adjustable delay lines to make the plurality of converting devices convert the plurality of delayed digital input signals at respective desire time points.

21 Claims, 9 Drawing Sheets

(51) Int. Cl.
  *H04L 7/00* (2006.01)
  *G01R 21/06* (2006.01)
  *G01R 23/00* (2006.01)
  *H03F 1/24* (2006.01)
  *H04L 27/20* (2006.01)

(56) References Cited

U.S. PATENT DOCUMENTS

| | | | |
|---|---|---|---|
| 6,943,602 B1* | 9/2005 | Lee | 327/158 |
| 6,998,378 B2* | 2/2006 | Panten et al. | 510/302 |
| 8,154,432 B2* | 4/2012 | Kaper et al. | 341/120 |
| 8,594,159 B2* | 11/2013 | Sekino | 375/219 |
| 2003/0141910 A1* | 7/2003 | Reindl | 327/158 |
| 2007/0182110 A1* | 8/2007 | Urababa | 280/5.508 |
| 2008/0252507 A1* | 10/2008 | Gerfers et al. | 341/155 |
| 2008/0292038 A1* | 11/2008 | Ide | 375/355 |
| 2009/0091400 A1* | 4/2009 | Orlik et al. | 332/103 |
| 2010/0013530 A1* | 1/2010 | Kim et al. | 327/149 |
| 2010/0194456 A1* | 8/2010 | Kang et al. | 327/158 |
| 2012/0068747 A1* | 3/2012 | Wan | 327/158 |
| 2012/0112810 A1* | 5/2012 | Wang et al. | 327/158 |
| 2012/0268184 A1* | 10/2012 | Baumann et al. | 327/277 |

* cited by examiner

DIGITAL TRANSMITTER AND METHOD FOR CALIBRATING DIGITAL TRANSMITTER

CROSS REFERENCE TO RELATED APPLICATIONS

This application claims the benefit of U.S. Provisional Application No. 61/825,630, which was filed on 2013 May 21 and is included herein by reference.

BACKGROUND

The present invention relates to a digital transmitter and a method for calibrating a digital transmitter, and more particularly to a low noise and low cost digital transmitter and related calibration method.

In wireless communication system, using a digital transmitter to digitally amplify and transmit RF (Radio Frequency) signal can be the most area saving and power efficient way. Conventionally, there have two ways to implement the digital transmitter. The first type is thermo-coding, and the second type is binary-coding. For the thermo-coding digital transmitter, the output power is a combination of a plurality of unit powers outputted by a plurality of unit cells. Therefore, a thermo-coding digital transmitter may need a lots of unit cells to generate a high power output signal. On the other hand, the binary-coding digital transmitter uses a plurality of binary-coding cells to generate an amplified output signal. The number of the binary-coding cells is less than the number of unit cells of the thermo-coding digital transmitter because the binary-coding cell may generate power higher than the unit power of the thermo-coding digital transmitter. However, the coding cells may have different cell delays. The different cell delays of the coding cells may increase the noise floor of the amplified output signal because the coding cells may output their respective signals at different time.

Therefore, how to solve the cell delay problem of a digital transmitter is an urgent problem in the field of wireless communication system.

SUMMARY

One objective of the present embodiment is to provide a low noise and low cost digital transmitter and related calibration method.

According to a first embodiment of the present invention, a digital transmitter is disclosed. The digital transmitter comprises a plurality of adjustable delay lines, a plurality of converting devices, and a calibration device. The plurality of adjustable delay lines is arranged to delay a plurality of digital input signals by a plurality of delay times to generate a plurality of delayed digital input signals respectively. The plurality of converting devices are arranged to convert the plurality of delayed digital input signals into a plurality of converting signals respectively. The calibration device is arranged to adjust a delay time of at least one adjustable delay line in the plurality of adjustable delay lines.

According to a second embodiment of the present invention, a method for calibrating a digital transmitter is disclosed. The method comprises the steps: using a plurality of adjustable delay lines to delay a plurality of digital input signals by a plurality of delay times to generate a plurality of delayed digital input signals respectively; using a plurality of converting devices to convert the plurality of delayed digital input signals into a plurality of converting signals respectively; and adjusting a delay time of at least one adjustable delay line in the plurality of adjustable delay lines.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
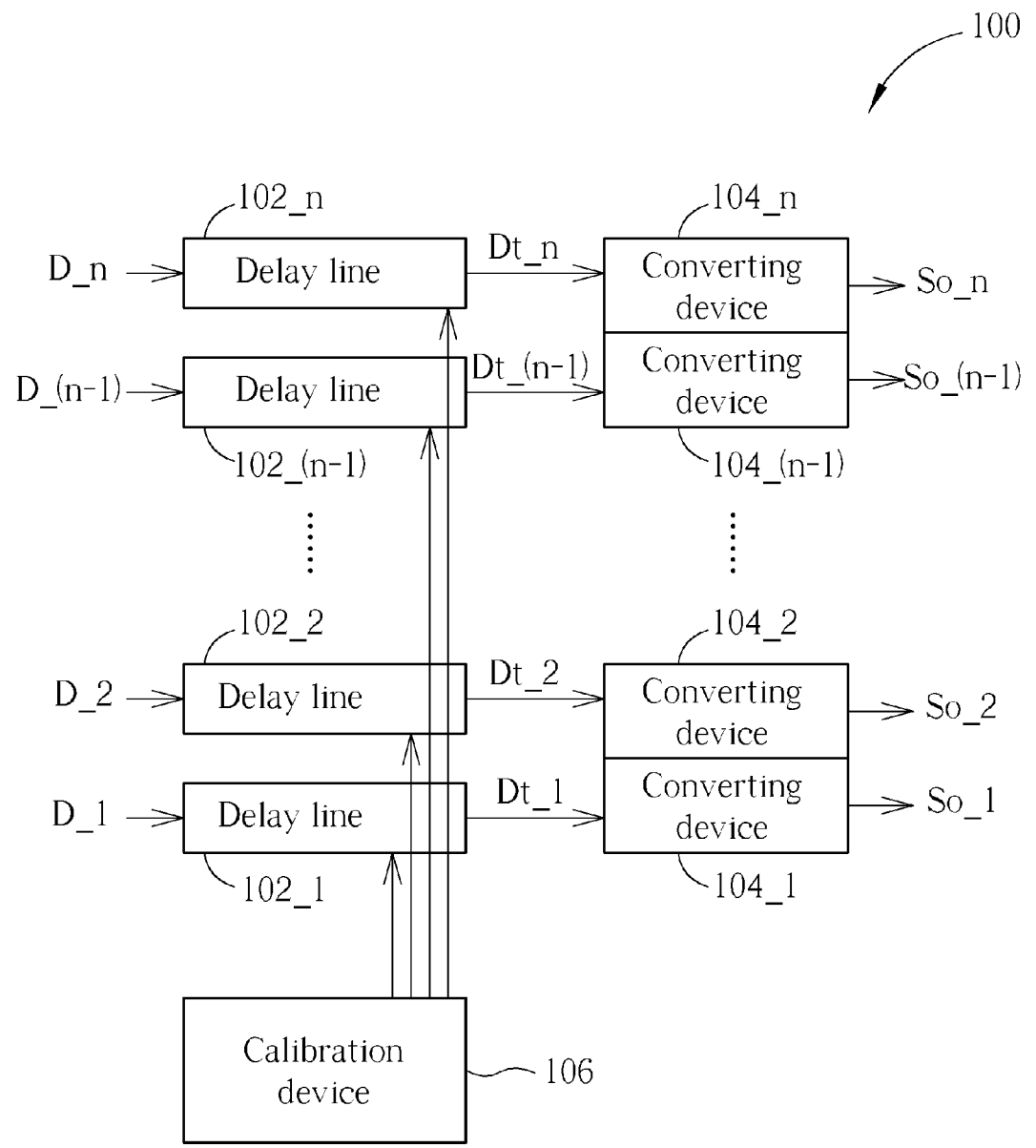
FIG. 1 is a diagram illustrating a digital transmitter according to a first embodiment of the present invention.

Please refer to FIG. 1, which is a diagram illustrating a digital transmitter 100 according to a first embodiment of the present invention. The digital transmitter is generally arranged to receive baseband signals, to digitally amplify and up-convert the baseband signals to radio frequency, and to combine the up-converted signals into an output RF signal to be transmitted by an antenna. For illustration purpose, FIG. 1 only shows a portion (e.g. an output stage) of the digital transmitter. The digital transmitter 100 comprises a plurality of adjustable delay lines 102_1-102_$n$, a plurality of converting devices (e.g. coding cells) 104_1-104_$n$, and a calibration device 106. The plurality of adjustable delay lines 102_1-102_$n$ arranged to delay a plurality of digital input signals D_1-D_n by a plurality of delay times t_1-t_n to generate a plurality of delayed digital input signals Dt_1-Dt_n respectively. The plurality of converting devices 104_1-104_n are arranged to convert the plurality of delayed digital input signals Dt_1-Dt_n into a plurality of converting signals So_1-So_n respectively. The plurality of converting signals So_1-So_n are then combined in order to generate the output RF signal of the digital transmitter 100. The calibration device 106 is arranged to adjust a delay time of at least one adjustable delay line in the plurality of adjustable delay lines 102_1-102_n to make the plurality of converting devices 104_1-104_n convert the plurality of delayed digital input signals Dt_1-Dt_n at respective desire time points; for example, for releasing the cell delay problem, the at least one adjustable delay line is adjusted to make at least two converting devices convert the delayed digital input signals substantially at the same time. It can also be extended to make the plurality of converting devices 104_1-104_n convert the plurality of delayed digital input signals Dt_1-Dt_n at the same time.

Following takes the binary-coding scheme as an example to explain the proposed calibration mechanism. The plurality of digital input signals D_1-D_n are a plurality of binary-coding digital bits respectively, wherein the digital input signal D_1 is the least significant bit (LSB) and the digital input signal D_n is the most significant bit (MSB) in the binary-coding digital bits. Therefore, the significances of the plurality of digital input signals D_1-D_n are orderly increased from D_1 to D_n. The plurality of binary-coding converting devices 104_1-104_n are arranged to generate the plurality of converting signals So_1-So_n having powers of $P*2^0$, $P*2^1$, $P*2^2$, ..., $P*2^{(n-1)}$ respectively when plurality of binary-coding converting devices 104_2-104_n are turned on individually, in which P is the power of the converting signal So_1 generated by the converting device 102_1. In other words, the areas of the plurality of binary-coding converting devices 104_1-104_n are $A*2^0$, $A*2^1$, $A*2^2$, ..., $A*2^{(n-1)}$ respectively in order to generate the above mentioned powers, in which A is the area of the converting device 102_1. However, in practice, the plurality of binary-coding converting devices 104_1-104_n may not receive the plurality of digital input signals D_1-D_n at the same time. Accordingly, the plurality of adjustable delay lines 102_1-102_n are used to provide the plurality of delay times t_1-t_n to the plurality of digital input signals D_1-D_n in order to make the plurality of delayed digital input signals Dt_1-Dt_n reach the plurality of binary-coding converting devices 104_1-104_n substantially at the same time. Therefore, the present calibration device 106 is aimed on adjust the plurality of delay times t_1-t_n to make the plurality of delayed digital input signals Dt_1-Dt_n reach the plurality of binary-coding converting devices 104_1-104_n substantially at the same time.

Figure 2:
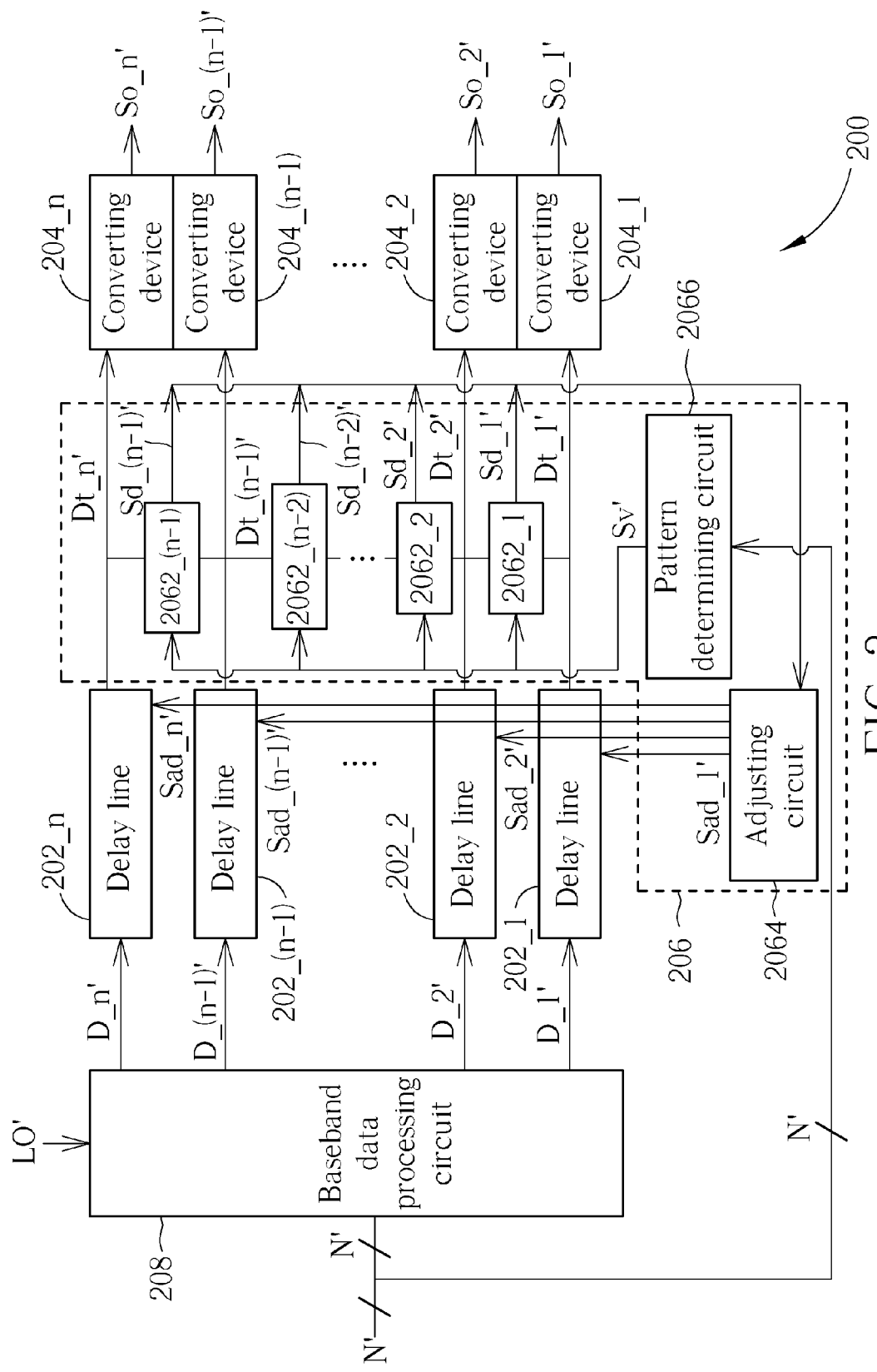
FIG. 2 is a diagram illustrating a digital transmitter according to a second embodiment of the present invention.

By using the concept of the digital transmitter 100 as shown in FIG. 1, a second embodiment is disclosed in FIG. 2. FIG. 2 is a diagram illustrating a digital transmitter 200 according to a second embodiment of the present invention. The digital transmitter 200 comprises a plurality of adjustable delay lines 202_1-202_n, a plurality of binary-coding converting devices 204_1-204_n, a calibration device 206, and a baseband data processing circuit 208. The baseband data processing circuit 208 is arranged to modulate a digital baseband data N' to generate a plurality of digital input signals D_1'-D_n' according to an oscillating signal LO'. For example, the digital baseband data N' is a differential digital baseband data having a differential in-phase component and a differential quadrature component, and the oscillating signal LO' is arranged to sample the differential in-phase component and the differential quadrature component to generate the plurality of digital input signals D_1'-D_n'.

The plurality of adjustable delay lines 202_1-202_n are arranged to delay the plurality of digital input signals D_1'-D_n' by a plurality of delay times t_1'-t_n' to generate a plurality of delayed digital input signals Dt_1'-Dt_n' respectively. The plurality of binary-coding converting devices 204_1-204_n are arranged to convert the plurality of delayed digital input signals Dt_1'-Dt_n' into a plurality of converting signals So_1'-So_n' respectively. It is noted that the plurality of converting signals So_1'-So_n' are combined to be an amplified transmitting signal when the digital transmitter 200 is under the normal transmitting operation.

The calibration device 206 comprises a plurality of edge detecting circuits 2062_1-2062_(n-1), an adjusting circuit 2064, and a pattern determining circuit 2066. As shown in FIG. 2, each edge detecting circuit is coupled between two consecutive adjustable delay lines in the plurality of adjustable delay lines 202_1-202_n for generating a determination signal to determine if a first signal edge of a first delayed digital input signal outputted by a first adjustable delay line in the two consecutive adjustable delay lines is aligned with a second signal edge of a second delayed digital input signal outputted by a second adjustable delay line in the two consecutive adjustable delay lines. The adjusting circuit 2064 is arranged to one-by-one adjust the plurality of delay times t_1'-t_n' of the plurality of adjustable delay lines 202_1-202_n to make the plurality of binary-coding converting devices 204_1-204_n receive the plurality of delayed digital input signals Dt_1'-Dt_n' substantially at the same time according to a plurality of determination signals Sd_1'-Sd_(n-1)' generated by a plurality of edge detecting circuits 2062_1-2062_(n-1) respectively. The pattern determining circuit 2066 is arranged to generate a valid signal Sv' by determining a digital signal pattern of the digital baseband data N'. If the digital signal pattern of the digital baseband data N' matches a predetermined digital pattern, the pattern determining circuit 2066 generates the valid signal Sv' to one-by-one enable the plurality of edge detecting circuits 2062_1-2062_(n-1).

More specifically, according the second embodiment, each edge detecting circuit is a bang-bang detector arranged to detect a first signal edge of a first delayed digital input signal and a second signal edge of a second delayed digital input signal. When the digital transmitter 200 performs the cell delay calibration, the plurality of edge detecting circuits 2062_1-2062_(n-1) are turned on one-by-one to detect the signal edges of two delayed digital input signals outputted by two consecutive adjustable delay lines respectively, and to one-by-one output plurality of determination signals Sd_1'-Sd_(n-1)'. Meanwhile, the adjusting circuit 2064 also one-by-one adjusts the plurality of delay times t_1'-t_n' of the plurality of adjustable delay lines 202_1-202_n according to the plurality of determination signals Sd_1'-Sd_(n-1)'.

For example, when the cell delay calibration of the digital transmitter 200 begins, the first edge detecting circuit 2062_1 is first activated or enabled to detect the signal edges (e.g. rising edges or falling edges) of the first delayed digital input signal Dt_1' and the second delayed digital input signal Dt_2'. Then, the first edge detecting circuit 2062_1 outputs the first determination signal Sd_1' to the adjusting circuit 2064. The adjusting circuit 2064 determines if the second delayed digital input signal Dt_2' leads or lags behind the first delayed digital input signal Dt_1' according to the first determination signal Sd_1'. Then, the adjusting circuit 2064 outputs a second adjusting signal Sad_2' to adjust the delay time t_2' of the second adjustable delay lines 202_2 to align the signal edges of the first delayed digital input signal Dt_1' and the second delayed digital input signal Dt_2', which turns to make the first delayed digital input signal Dt_1' and the second delayed digital input signal Dt_2' to reach the binary-coding converting devices 204_1 and 204_2 substantially at the same time.

Then, the second edge detecting circuit 2062_2 is activated to detect the signal edges of the second delayed digital input signal Dt_2' and the third delayed digital input signal Dt_3' for generating the second determination signal Sd_2' to the adjusting circuit 2064. The adjusting circuit 2064 determines if the third delayed digital input signal Dt_3' leads or lags behind the second delayed digital input signal Dt_2' according to the second determination signal Sd_2'. Then, the adjusting circuit 2064 outputs a third adjusting signal Sad_3' to adjust the delay time t_3' of the third adjustable delay lines 202_3 to make the second delayed digital input signal Dt_2' and the third delayed digital input signal Dt_3' to reach the binary-coding converting devices 204_2 and 204_3 substantially at the same time.

By using the similar idea, the calibration repeats until all of the plurality of delay times t_1'-t_n' of the plurality of adjustable delay lines 202_1-202_n are calibrated such that the plurality of delayed digital input signals Dt_1'-Dt_n' reach the plurality of binary-coding converting devices 204_1-204_n substantially at the same time. It is noted that the calibration may be started at the first adjustable delay line 202_1 and stopped at the first adjustable delay line 202_1 to form a closed loop calibration, or started at the first adjustable delay line 202_1 and stopped at the last adjustable delay line 202_n to form an open loop calibration.

Figure 3:
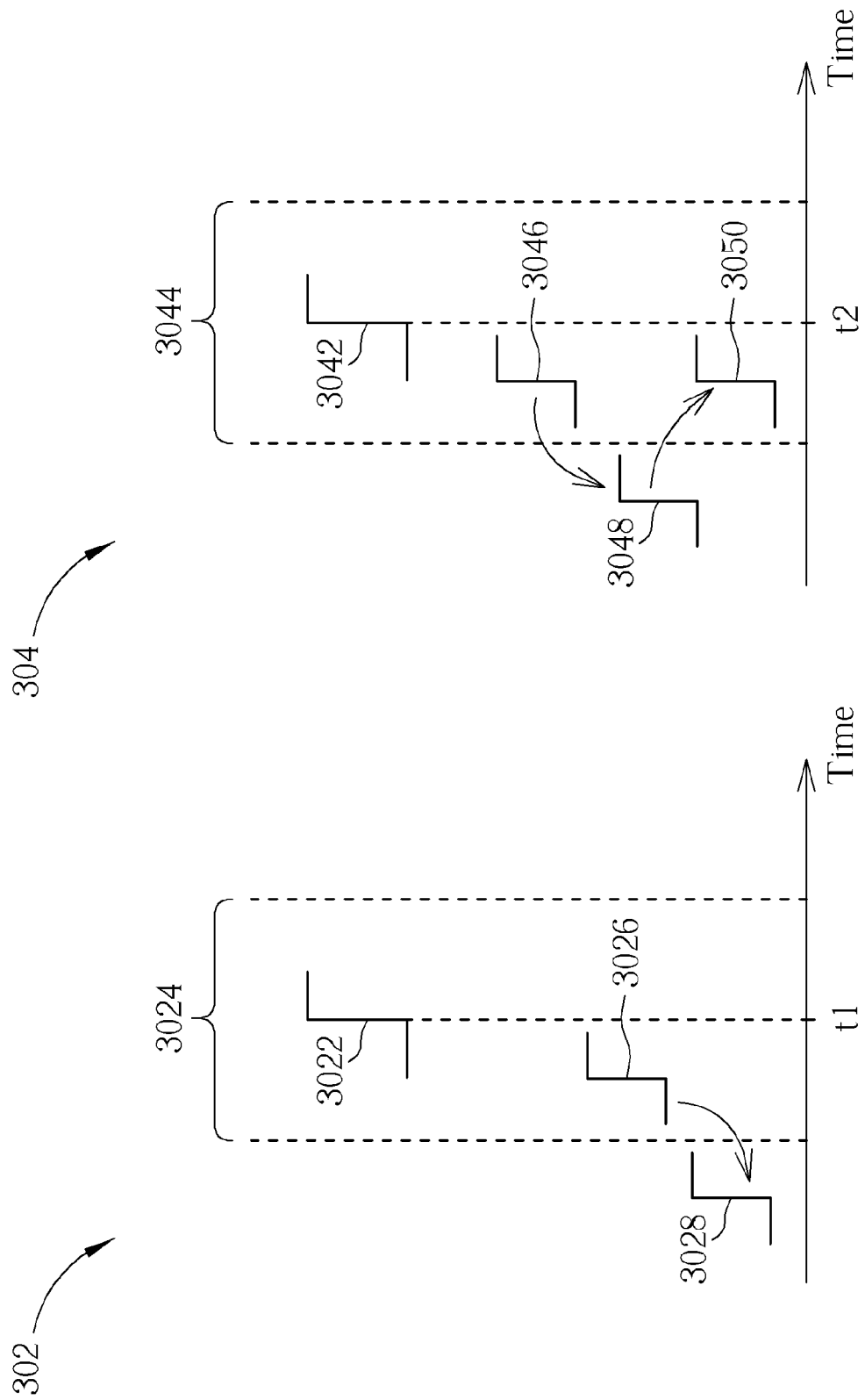
FIG. 3 is a diagram illustrating two signal edges of two consecutive adjustable delay lines after performing a first time of calibration and a second time of calibration according to an embodiment of the present invention.

Moreover, for two consecutive adjustable delay lines, the edge detecting circuit and the adjusting circuit 2064 are arranged to perform at least twice (or any even times) of the calibration upon an adjustable delay line in the two consecutive adjustable delay lines in order to overcome the dead-zone problem of the edge detecting circuit. More specifically, please refer to FIG. 3, which is a diagram illustrating the two signal edges of the two consecutive adjustable delay lines after performing a first time of calibration and a second time of calibration according to an embodiment of the present invention. For brevity, the two consecutive adjustable delay lines are the first adjustable delay line 202_1 and the second adjustable delay line 202_2. In the left side 302 of FIG. 3, the signal edge 3022 of the first delayed digital input signal Dt_1' is on time t1, and the dead-zone of the first edge detecting circuit 2062_1 is regarded as the range 3024 around the time t1. Then, if the signal edge 3026 of the second delayed digital input signal Dt_2' is in the dead-zone 3024 of the first edge detecting circuit 2062_1, the first edge detecting circuit 2062_1 may not correctly determine the lead/lag relationship of the first delayed digital input signal Dt_1' and the second delayed digital input signal Dt_2'. When this happens, the first edge detecting circuit 2062_1 may outputs an incorrect first determination signal Sd_1' to the adjusting circuit 2064. Then the adjusting circuit 2064 may incorrectly adjust the signal edge 3026 of the second delayed digital input signal Dt_2' to leave the signal edge 3022 of the first delayed digital input signal Dt_1', i.e. the signal edge 3028 outside the dead-zone 3024. Consequently, the delay time calibration of the first adjustable delay line 202_1 and the second adjustable delay line 202_2 may fail.

To overcome the above problem, the first edge detecting circuit 2062_1 and the adjusting circuit 2064 perform twice (or any even times) of the calibration upon the second adjustable delay line 202_2. In the right side 304 of FIG. 3, the signal edge 3042 of the first delayed digital input signal Dt_1' is on time t2, and the dead-zone of the first edge detecting circuit 2062_1 is regarded as the range 3044 around the time t2. Then, as mentioned in above paragraph, if the signal edge 3046 of the second delayed digital input signal Dt_2' is in the dead-zone 3044 of the first edge detecting circuit 2062_1, the adjusting circuit 2064 may incorrectly adjust the signal edge 3046 of the second delayed digital input signal Dt_2' to leave the signal edge 3042 of the first delayed digital input signal Dt_1', i.e. the signal edge 3048 outside the dead-zone 3044. Now, the first edge detecting circuit 2062_1 and the adjusting circuit 2064 perform the second time of the calibration upon the second adjustable delay line 202_2 to calibrate the signal edge 3048 of the second delayed digital input signal Dt_2' to approach the signal edge 3042 of the first delayed digital input signal Dt_1' again as indicated by the signal edge 3050. Accordingly, by performing even times of the calibration upon the plurality of adjustable delay lines 202_1-202_n, the accumulated error probability due to the comparison dead-zone of the edge detecting circuit is reduced.

In another embodiment, using an amplifier to amplify the time difference between the signal edges of the two delayed digital input signals before deciding their lead/lag relationship can reduce the dead-zone affect as well. In yet another embodiment, a dithering technique may be applied onto the determination signal output by the adjusting circuit 2064 to decrease the accumulated error probability. These modifications shall all fall within the scope of the present invention.

Figure 4:
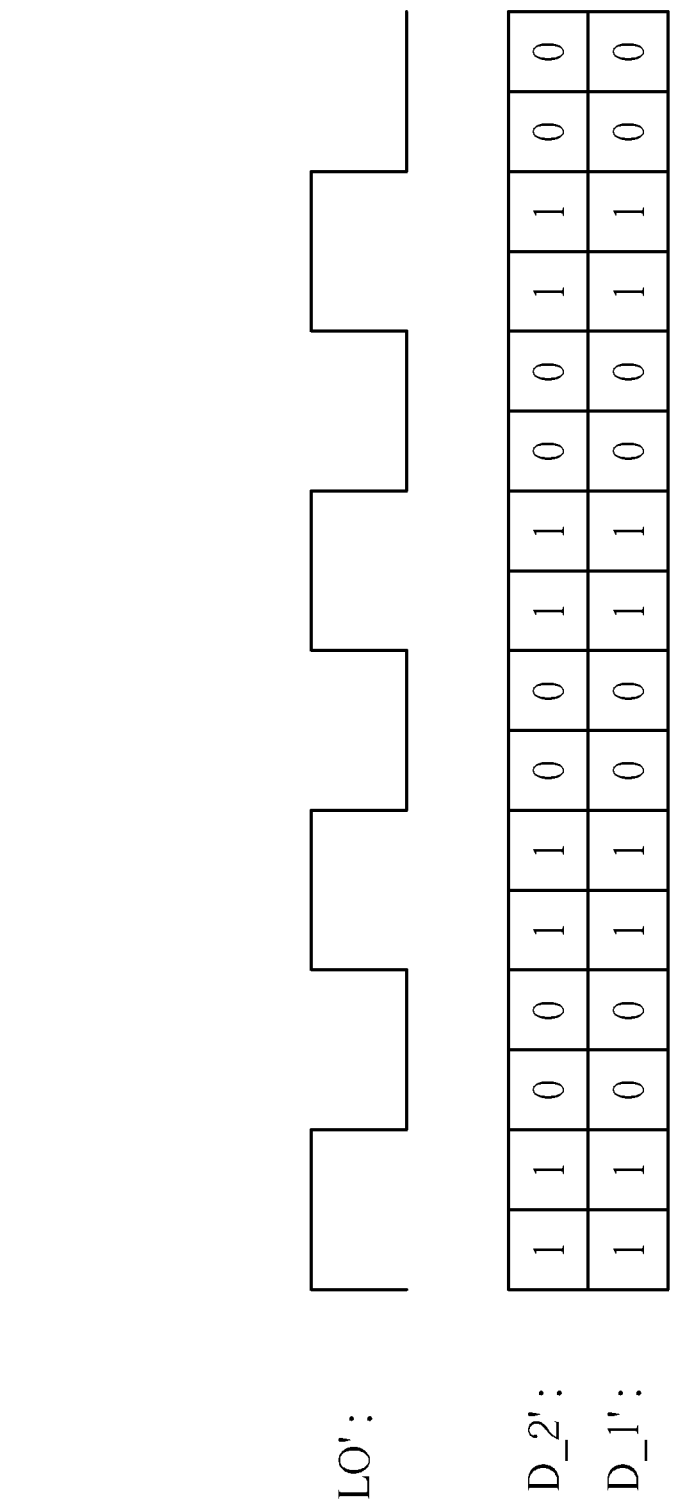
FIG. 4 is a timing diagram of a first the digital input signal and a second digital input signal that conform to a predetermined digital signal pattern according to an embodiment of the present invention.

Moreover, for two consecutive adjustable delay lines, to detect the signal edges of the two delayed digital input signals outputted by the two consecutive adjustable delay lines respectively, the corresponding two digital input signals must be conformed to a predetermined digital signal pattern. In other words, the two digital input signals must have the same rising-edge time and/or the same falling-edge time. Take the first adjustable delay line 202_1 and the second adjustable delay line 202_2 for example, FIG. 4 shows a timing diagram of the first digital input signal D_1' and the second digital input signal D_2' that conform to the predetermined digital signal pattern according to an embodiment of the present invention. In FIG. 4, it can be seen that the first the digital input signal D_1' and the second digital input signal D_2' are synchronized to the oscillating signal LO', and the data of the first the digital input signal D_1' is the same as the data the second digital input signal D_2'. Therefore, the signal edges of the first the digital input signal D_1' and the second digital input signal D_2' must be the same before inputting to the first adjustable delay line 202_1 and the second adjustable delay line 202_2 respectively.

In this embodiment, the pattern determining circuit 2066 is arranged to detect if the digital signal patterns of the first digital input signal D_1' and the second digital input signal D_2' conform to the predetermined digital signal pattern according to the digital baseband data N'. If the digital signal patterns of the first the digital input signal D_1' and the second digital input signal D_2' conform to the predetermined digital signal pattern, the pattern determining circuit 2066 generates the valid signal Sv' to active/enable the first edge detecting circuit 2062_1 to start detect the signal edges of the first the digital input signal D_1' and the second digital input signal D_2'. After the calibration of the first adjustable delay line 202_1 and the second adjustable delay line 202_2, the pattern determining circuit 2066 then goes on to detect the digital signal patterns of the next two digital input signal (e.g. the digital input signal D_2' and the third digital input signal D_3') until all the plurality of adjustable delay lines 202_1-202_n are calibrated.

The edge detection is performed when the predetermined digital pattern is recognized from the digital baseband data N', and this is for achieving background calibration. In other designs, the baseband data processing circuit 208 may generate a test pattern for performing delay calibration, and then the pattern determination step may be omitted.

Figure 5:
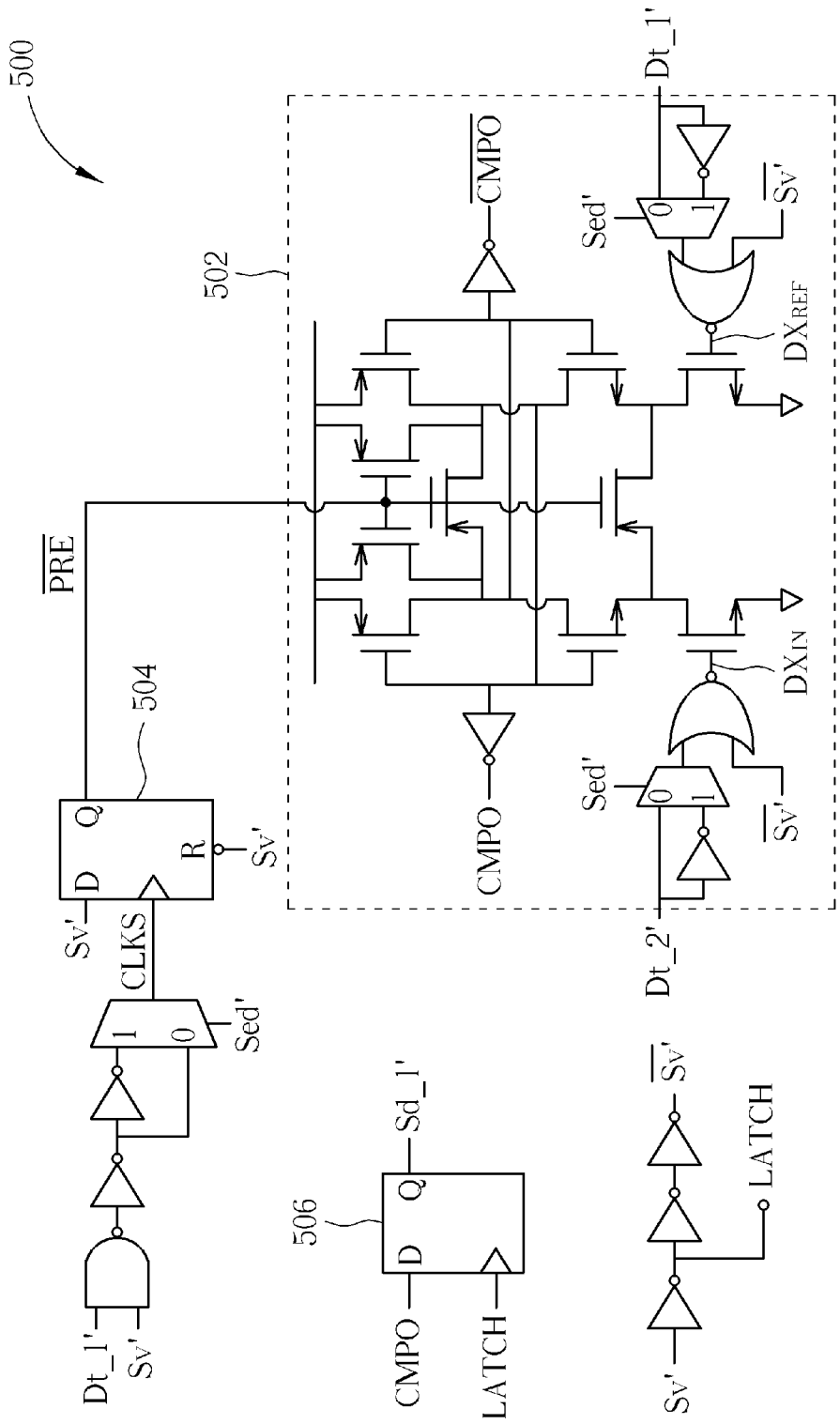
FIG. 5 is a diagram illustrating an edge detecting circuit according to an embodiment of the present invention.

Please refer to FIG. 5, which is a diagram illustrating an edge detecting circuit 500 according to an embodiment of the present invention. The edge detecting circuit 500 is a low-power data-aware phase/edge detector. The edge detecting circuit 500 at least comprises a latch 502, a first D-flip-flop (DFF) 504, and a second DFF 506. The latch 502 is arranged to compare the signal edges of two delayed digital input signals (e.g. Dt_1' and Dt_2') according to the valid signal Sv', and to output a determination signal (e.g. Sd_1') for determining the lead/lag between the two delayed digital input signals. The first DFF 504 is arranged to pre-charge the latch 502 to increase the operating speed of the edge detecting circuit 500. The second DFF 506 is arranged to output the determination signal according to the valid signal Sv', wherein the valid signal Sv' has low toggling rate. Moreover, the edge detecting circuit 500 also receives an edge control signal Sed'. The edge control signal Sed' is used to control the multiplexes of the edge detecting circuit 500 to control if the edge detecting circuit 500 is arranged to detect the falling edges of the two delayed digital input signals or the rising edges of the two delayed digital input signals. For example, when the edge control signal Sed' is 0, the edge detecting circuit 500 detects the falling edges of the two delayed digital input signals. When the edge control signal Sed' is 1, the edge detecting circuit 500 detects the rising edges of the two delayed digital input signals. The circuit elements of the edge detecting circuit 500 and their connectivity has been shown in FIG. 5, thus detailed description is omitted here for brevity.

Figure 6:
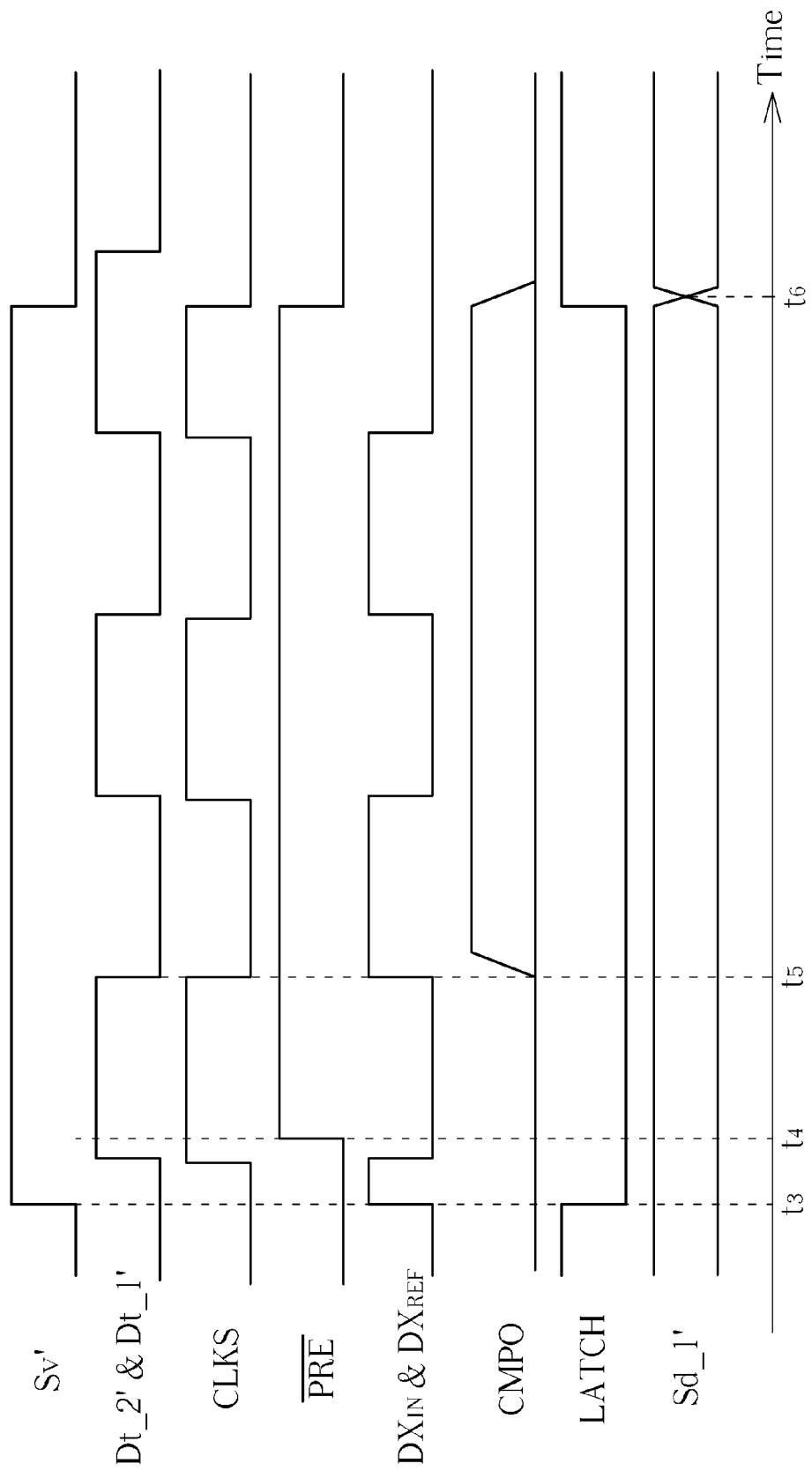
FIG. 6 is a timing diagram illustrating a valid signal, two delayed digital input signals, a clock signal, a pre-charge signal, two activation signals, an output signal, a latch control signal, and a determination signal of the edge detecting circuit according to an embodiment of the present invention.

Take the first adjustable delay line 202_1 and the second adjustable delay line 202_2 for example, FIG. 6 is a timing diagram illustrating the valid signal Sv', the two delayed digital input signals Dt_1' and Dt_2', a clock signal CLKS, a pre-charge signal PRE, two activation signals $DX_{IN}$ and $DX_{REF}$, an output signal CMPO, a latch control signal LATCH, and the determination signal Sd_1' of the edge detecting circuit 500 according to an embodiment of the present invention. In FIG. 6, the edge detecting circuit 500 is arranged to detect the falling edges of the two delayed digital input signals. At time t3, the valid signal Sv' is generated by the pattern determining circuit 2066. At time t4, the first DFF 504 output the invert of pre-charge signal $\overline{PRE}$ to release the pre-charge state of the latch 502 and then to enter the evaluation state. At time t5, which is at the falling edges of Dt_1' and Dt_2', the latch 502 outputs the output signal CMPO to the second DFF 506. At time t6, the second DFF 506 generates the determination signal Sd_1' including the lead/lag information of the two delayed digital input signals Dt_1' and Dt_2' to the adjusting circuit 2064.

Although FIG. 6 shows the timing diagram of the detection of the falling edges of the two delayed digital input signals, those skilled in the art are appreciated to understand the detection of the rising edges of the two delayed digital input signals. Thus, the detailed description is omitted here for brevity.

Figure 7:
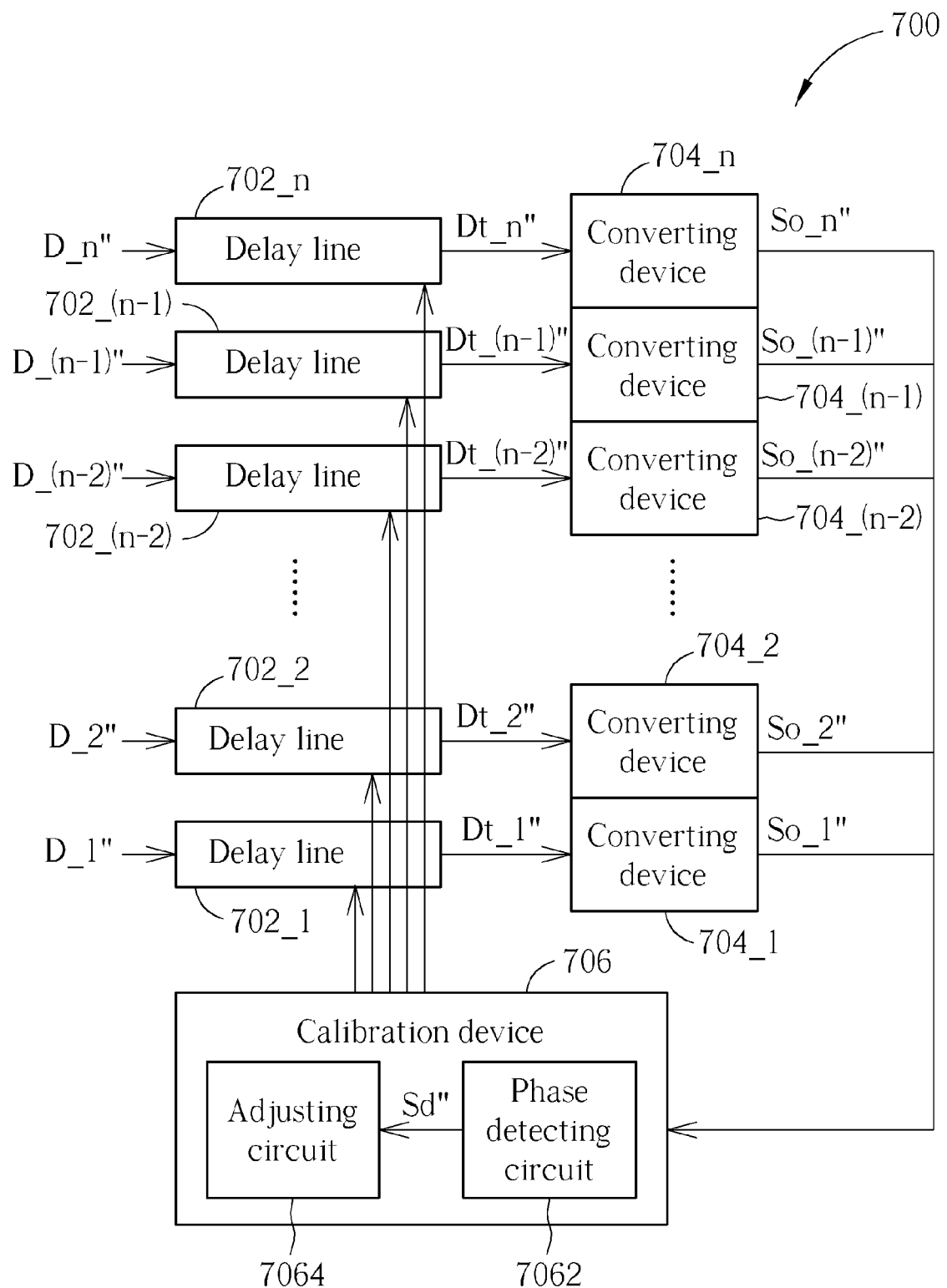
FIG. 7 is a diagram illustrating a digital transmitter according to a third embodiment of the present invention.

By using the concept of the digital transmitter 100 as shown in FIG. 1, a third embodiment is disclosed in FIG. 7. FIG. 7 is a diagram illustrating a digital transmitter 700 according to a third embodiment of the present invention. The digital transmitter 700 comprises a plurality of adjustable delay lines 702_1-702_n, a plurality of converting devices (e.g. coding cells) 704_1-704_n, and a calibration device 706.

The plurality of adjustable delay lines 702_1-702_n are arranged to delay a plurality of digital input signals D_1"-D_n" by a plurality of delay times t_1"-t_n" to generate a plurality of delayed digital input signals Dt_1"-Dt_n" respectively. The plurality of converting devices 704_1-704_n are arranged to convert the plurality of delayed digital input signals Dt_1"-Dt_n" into a plurality of converting signals So_1"-So_n" respectively. The plurality of converting signals So_1"-So_n" are combined to be an amplified transmitting signal when the digital transmitter 700 is under the normal transmitting operation.

The calibration device 706 comprises a phase detecting circuit 7062 and an adjusting circuit 7064. The phase detecting circuit 7062 is coupled to the outputs of the plurality of converting devices 704_1-704_n. The phase detecting circuit 7062 is arranged to detect a phase difference between a first converting signal and a second converting signal in the plurality of converting signals So_1"-So_n", wherein the first converting signal corresponds to a first delayed digital input signal in the plurality of delayed digital input signals Dt_1"-Dt_n", the first delayed digital input signal is outputted by a first adjustable delay line in the plurality of adjustable delay lines 702_1-702_n, the second converting signal corresponds to a second delayed digital input signal in the plurality of delayed digital input signals Dt_1"-Dt_n", and the second delayed digital input signal is outputted by a second adjustable delay line in the plurality of adjustable delay lines 702_1-702_n. The adjusting circuit 7064 is arranged to adjust a first delay time of the first adjustable delay line and/or a second delay time of the second adjustable delay line to substantially cancel the phase difference between the first converting signal and the second converting signal.

It is noted that if there has phase mismatch occurs between the plurality of converting signals So_1"-So_n", noise and unwanted spurs may be induced in the amplified transmitting signal. Therefore, to reduce the noise and unwanted spurs in the amplified transmitting signal, the calibration device 706 in the third embodiment is arranged to one-by-one detect the phase difference between two converting signals in the plurality of converting signals So_1"-So_n" and adjust one of the corresponding two adjustable delay lines to eliminate or reduce the phase difference between two converting signals. For example, the phase detecting circuit 7062 is arranged to first detect a phase difference between the first converting signal So_1" and the second converting signal So_2" to generate a determination signal Sd" to the adjusting circuit 7064. Then, the adjusting circuit 7064 adjusts the second adjustable delay line 702_2 to cancel the phase difference between the first converting signal So_1" and the second converting signal So_2".

Then, the phase detecting circuit 7062 goes on detect a phase difference between the second converting signal So_2" and the third converting signal So_3" to generate the determination signal Sd" to the adjusting circuit 7064. Then, the adjusting circuit 7064 adjusts the third adjustable delay line 702_3 to cancel the phase difference between the second converting signal So_2" and the third converting signal So_3". Then, the calibration device 706 goes on the calibration until all of the adjustable delay lines 702_1-702_n are calibrated such that the plurality of converting signals So_1"-So_n" have substantially the same phase. It is noted that the calibration may be start at the first adjustable delay line 702_1 and stop at the first adjustable delay line 702_1 to form a closed loop calibration, or start at the first adjustable delay line 702_1 and stop at the last adjustable delay line 702_n to form an open loop calibration.

In addition, the calibration device 706 is not the limitation of the present invention. In another embodiment of the calibration device 706, the phase detecting circuit 7062 is arranged to detect a phase difference between a first converting signal in the plurality of converting signals So_1"-So_n" and a second converting signal, wherein the first converting signal corresponds to a first delayed digital input signal in the plurality of delayed digital input signals Dt_1"-Dt_n", the first delayed digital input signal is outputted by a first adjustable delay line in the plurality of adjustable delay lines 702_1-702_n, the second converting signal is a combination signal of the plurality of converting signals So_1"-So_n". The adjusting circuit 7064 is arranged to adjust a first delay time of the first adjustable delay line to substantially cancel the phase difference between the first converting signal and the second converting signal.

More specifically, a reference signal generating circuit (not shown) is further included in the calibration device 706. The reference signal generating circuit is a duplicate circuit of the first adjustable delay line 702_1 and the first converting device 704_1. Therefore, the reference signal generating circuit generates a reference signal similar to the first converting signal So_1". When the calibration device 706 starts the calibration, the phase detecting circuit 7062 is arranged to first detect a phase difference between the second converting signal So_2" and a combination signal of the first converting signal So_1" and the reference signal to generate a determination signal Sd" to the adjusting circuit 7064. Then, the adjusting circuit 7064 adjusts the second adjustable delay line 702_2 to cancel the phase difference between the second converting signal So_2" and the combination signal of the first converting signal So_1" and the reference signal combination signal of the first converting signal So_1" and the reference signal. It should be noted that, in this embodiment, the power of the combination signal of the first converting signal So_1' and the reference signal is equal to the power of the second converting signal So_2". For example, if the power of the first converting signal So_1' is P, then the power of the reference signal is also P, the power of the power of the combination signal of the first converting signal So_1" and the reference signal, and the power of the second converting signal So_2" is also 2*P. In this calibration, the second converting signal So_2" and the combination signal of the first converting signal So_1" and the reference signal are generated in different times.

Then, the phase detecting circuit 7062 is arranged to detect a phase difference between the third converting signal So_3" and a combination signal of the second converting signal So_2', the first converting signal So_1", and the reference signal to generate the determination signal Sd" to the adjusting circuit 7064. Then, the adjusting circuit 7064 adjusts the third adjustable delay line 702_3 to cancel the phase difference between the third converting signal So_3" and the combination signal of the second converting signal So_2", the first converting signal So_1", and the reference signal. Now, the power of third converting signal So_3" is 4*P, and the power of the combination signal of the second converting signal So_2", the first converting signal So_1", and the reference signal is also 4*P (i.e. 2*P+P+P).

Then, the phase detecting circuit 7062 goes on detect a phase difference between the fourth converting signal So_4" and a combination signal of the third converting signal So_3", the second converting signal So_2", the first converting signal So_1", and the reference signal to generate the determination signal Sd" to the adjusting circuit 7064. Then, the adjusting circuit 7064 adjusts the fourth adjustable delay line 702_4 to cancel the phase difference between the fourth converting signal So_4" and the combination signal of the third converting signal So_3", the second converting signal So_2", the first converting signal So_1", and the reference signal. Then, the calibration device 706 goes on the calibration until all of the adjustable delay lines 702_1-702_n are calibrated such that the plurality of converting signals So_1"-So_n" have substantially the same phase. It is noted that the calibration may be start at the first adjustable delay line 702_1 and stop at the first adjustable delay line 702_1 to form a closed loop calibration, or start at the first adjustable delay line 702_1 and stop at the last adjustable delay line 702_n to form an open loop calibration.

As mentioned above, since the phase mismatch between the plurality of converting signals So_1"-So_n" may induce noise and unwanted spurs, the phase detecting circuit 7062 may be modified to detect noise levels instead of phase characteristics. The calibration device 706 may one-by-one adjusts the plurality of adjustable delay lines 702_1-702_n according to a noise level of the plurality of converting signals So_1"-So_n" in order to reduce the noise level. By calibrating the noise floor, the delay mismatch between the plurality of delay lines 702_1-702_n is calibrated simultaneously.

Figure 8:
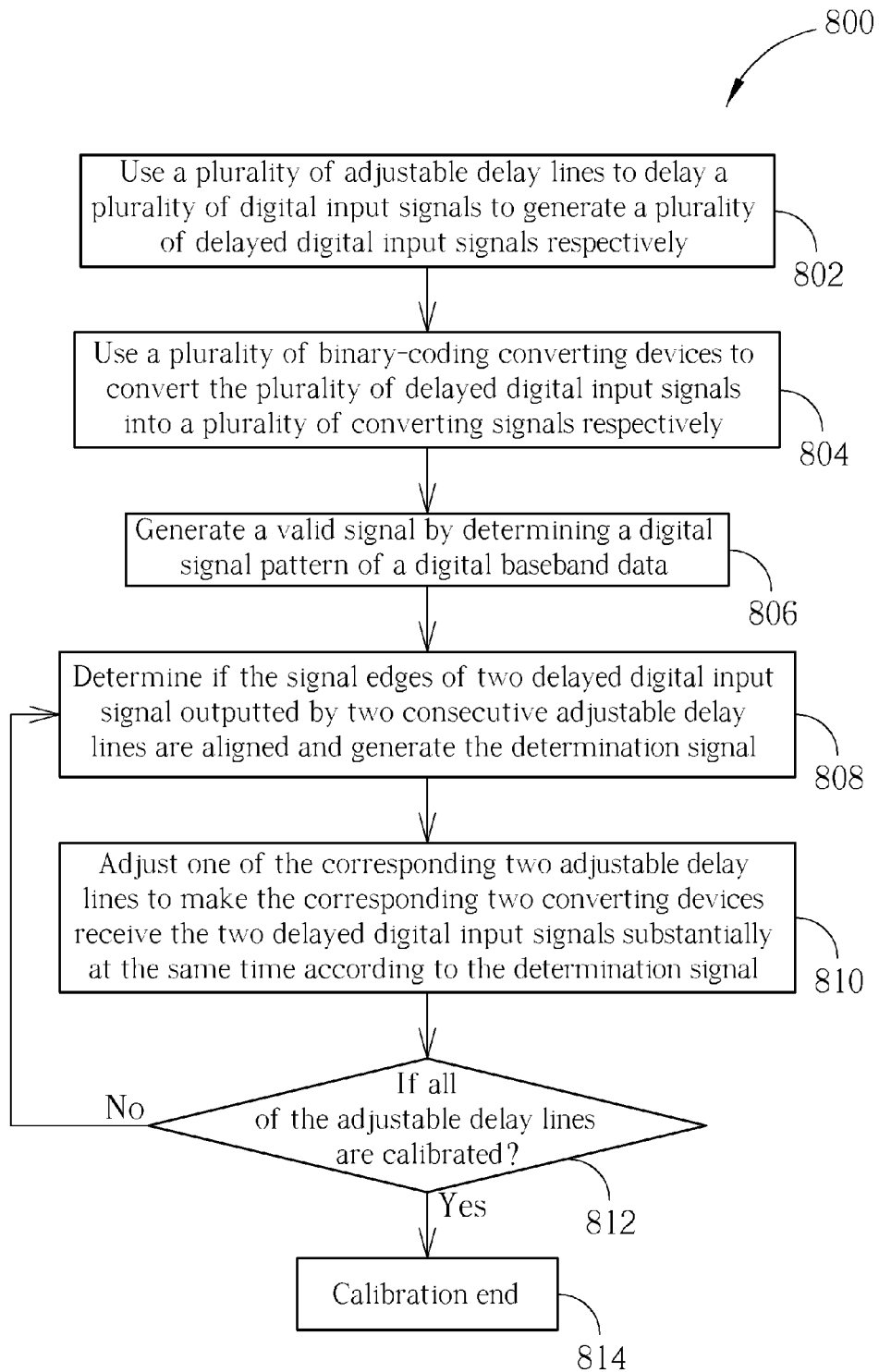
FIG. 8 is a flowchart illustrating a method for calibrating the digital transmitter according to a first embodiment of the present invention.

FIG. 8 is a flowchart illustrating a method 800 for calibrating the digital transmitter 200 according to a first embodiment of the present invention. Provided that substantially the same result is achieved, the steps of the flowchart shown in FIG. 8 need not be in the exact order shown and need not be contiguous, that is, other steps can be intermediate. The method 800 comprises:

Step 802: Use the plurality of adjustable delay lines 202_1-202_n to delay the plurality of digital input signals D_1'-D_n' by the plurality of delay times t_1'-t_n' to generate the plurality of delayed digital input signals Dt_1'-Dt_n' respectively;

Step 804: Use the plurality of binary-coding converting devices 204_1-204_n to convert the plurality of delayed digital input signals Dt_1'-Dt_n' into the plurality of converting signals So_1'-So_n' respectively;

Step 806: Generate the valid signal Sv' by determining the digital signal pattern of the digital baseband data N';

Step 808: Determine if the signal edges of two delayed digital input signal outputted by two consecutive adjustable delay lines are aligned and generate the determination signal; and Step 810: Adjust one of the corresponding two adjustable delay lines to make the corresponding two converting devices receive the two delayed digital input signals substantially at the same time according to the determination signal;

Step 812: Determine if all of the adjustable delay lines 702_1-702_n are calibrated, if yes, go to step 814; if no, go to step 808;

Step 814: Calibration end.

Figure 9:
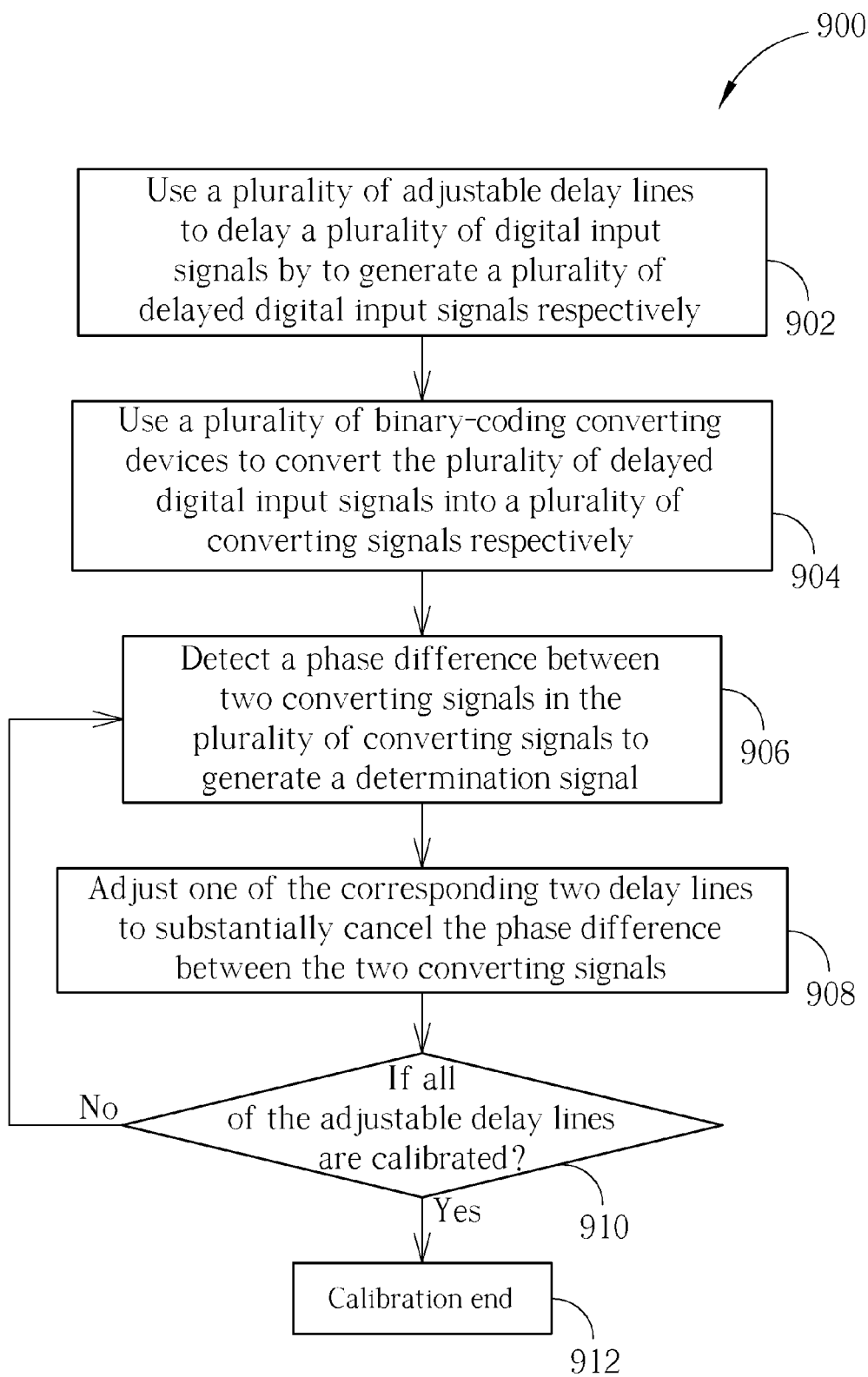
FIG. 9 is a flowchart illustrating a method for calibrating the digital transmitter according to a second embodiment of the present invention.

Moreover, FIG. 9 is a flowchart illustrating a method 900 for calibrating the digital transmitter 700 according to a second embodiment of the present invention. Provided that substantially the same result is achieved, the steps of the flowchart shown in FIG. 9 need not be in the exact order shown and need not be contiguous, that is, other steps can be intermediate. The method 900 comprises:

Step 902: Use the plurality of adjustable delay lines 702_1-702_n to delay the plurality of digital input signals D_1"-D_n" by the plurality of delay times t_1"-t_n" to generate the plurality of delayed digital input signals Dt_1"-Dt_n" respectively;

Step 904: Use the plurality of binary-coding converting devices 704_1-704_n to convert the plurality of delayed digital input signals Dt_1"-Dt_n" into the plurality of converting signals So_1"-So_n" respectively;

Step 906: Detect a phase difference between two converting signals in the plurality of converting signals So_1"-So_n" to generate the determination signal Sd";

Step 908: Adjust one of the corresponding two delay lines to substantially cancel the phase difference between the two converting signals;

Step 910: Determine if all of the adjustable delay lines 702_1-702_n are calibrated, if yes, go to step 912; if no, go to step 906;

Step 912: Calibration end.

Briefly, according to the description of the above embodiments, the present invention solves/reduces the output noise problem arises from the delay mismatch between the plurality of converting devices. The present invention uses a feedback loop to detect the signal edges of the delayed digital input signals or to detect the phase differences or noises of the converting signals, and accordingly adjust the adjustable delay lines for reducing the noise floor of output amplified signal. Accordingly, the present invention has the advantages of high accuracy and high resolution. The present invention is also simple to be implemented. The area and current consumption of the present digital power amplifying apparatus are small either.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital transmitter, comprising:
a plurality of adjustable delay lines, arranged to delay a plurality of digital input signals by a plurality of delay times to generate a plurality of delayed digital input signals respectively;
a plurality of converting devices, arranged to convert the plurality of delayed digital input signals into a plurality of converting signals respectively; and
a calibration device, arranged to adjust a delay time of at least one adjustable delay line in the plurality of adjustable delay lines.

2. The digital transmitter of claim 1, wherein the calibration device comprises:
an edge detecting circuit, arranged to receive a first signal edge of a first delayed digital input signal outputted by a first adjustable delay line in the plurality of adjustable delay lines and a second signal edge of a second delayed digital input signal outputted by a second adjustable delay line in the plurality of adjustable delay lines, and to generate a detection signal; and
an adjusting circuit, arranged to adjust at least one of a first delay time of the first adjustable delay line and a second delay time of the second adjustable delay line according to the detection signal.

3. The digital transmitter of claim 2, wherein the first adjustable delay line and the second adjustable delay line are two consecutive adjustable delay lines in the plurality of adjustable delay lines.

4. The digital transmitter of claim 2, wherein the edge detecting circuit is a bang-bang detector.

5. The digital transmitter of claim 2, further comprising:
a baseband data processing circuit, arranged to modulate a digital baseband data to generate the plurality of digital input signals according to an oscillating signal;
wherein the calibration device further comprises:
a pattern determining circuit, arranged to generate a valid signal by determining a digital signal pattern of the digital baseband data;
wherein if the digital signal pattern of the digital baseband data matches a predetermined digital pattern, the pattern determining circuit generates the valid signal to enable the edge detecting circuit.

6. The digital transmitter of claim 1, wherein the calibration device comprises:
a plurality of edge detecting circuits, each edge detecting circuit is coupled between two consecutive adjustable delay lines in the plurality of adjustable delay lines, for generating a determination signal according to a first signal edge of a first delayed digital input signal outputted by a first adjustable delay line in the two consecutive adjustable delay lines and a second signal edge of a second delayed digital input signal outputted by a second adjustable delay line in the two consecutive adjustable delay lines; and
an adjusting circuit, arranged to one-by-one adjust the plurality of delay times of the plurality of adjustable delay lines according to the plurality of determination signals generated by the plurality of edge detecting circuits respectively.

7. The digital transmitter of claim 6, wherein the plurality of edge detecting circuits are bang-bang detectors.

8. The digital transmitter of claim 6, further comprising:
a baseband data processing circuit, arranged to modulate a digital baseband data to generate the plurality of digital input signals according to an oscillating signal;
wherein the calibration device further comprises:
a pattern determining circuit, arranged to generate a valid signal by determining a digital signal pattern of the digital baseband data;
wherein if the digital signal pattern of the digital baseband data matches a predetermined digital pattern, the pattern determining circuit generates the valid signal to one-by-one enable the plurality of edge detecting circuits.

9. The digital transmitter of claim 1, wherein the calibration device adjusts the at least one adjustable delay line according to a noise level of the plurality of converting signals.

10. The digital transmitter of claim 1, wherein the calibration device adjusts the at least one adjustable delay line according to a phase difference based on two converting signals in the plurality of converting signals.

11. The digital transmitter of claim 1, wherein the calibration device comprises:
a phase detecting circuit, arranged to detect a phase difference between a first converting signal and a second converting signal in the plurality of converting signals, wherein the first converting signal corresponds to a first delayed digital input signal in the plurality of delayed digital input signals, the first delayed digital input signal is outputted by a first adjustable delay line in the plurality of adjustable delay lines, the second converting signal corresponds to a second delayed digital input signal in the plurality of delayed digital input signals, and the second delayed digital input signal is outputted by a second adjustable delay line in the plurality of adjustable delay lines; and
an adjusting circuit, arranged to adjust at least one of a first delay time of the first adjustable delay line and a second delay time of the second adjustable delay line.

12. The digital transmitter of claim 1, wherein the calibration device comprises:
- a phase detecting circuit, arranged to detect a phase difference between a first converting signal in the plurality of converting signals and a second converting signal, wherein the first converting signal corresponds to a first delayed digital input signal in the plurality of delayed digital input signals, the first delayed digital input signal is outputted by a first adjustable delay line in the plurality of adjustable delay lines, the second converting signal is a combination signal of the plurality of converting signals; and
- an adjusting circuit, arranged to adjust a first delay time of the first adjustable delay line.

13. The digital transmitter of claim 12, wherein a power of the first converting signal substantially equals a power of the second converting signal.

14. A method for calibrating a digital transmitter, comprising:
- using a plurality of adjustable delay lines to delay a plurality of digital input signals by a plurality of delay times to generate a plurality of delayed digital input signals respectively;
- using a plurality of converting devices to convert the plurality of delayed digital input signals into a plurality of converting signals respectively; and
- adjusting a delay time of at least one adjustable delay line in the plurality of adjustable delay lines.

15. The method of claim 14, wherein the step of adjusting the delay time of at least one adjustable delay line in the plurality of adjustable delay lines comprises:
- receiving a first signal edge of a first delayed digital input signal outputted by a first adjustable delay line in the plurality of adjustable delay lines and a second signal edge of a second delayed digital input signal outputted by a second adjustable delay line in the plurality of adjustable delay lines to generate a detection signal; and
- adjusting at least one of a first delay time of the first adjustable delay line and a second delay time of the second adjustable delay line according to the detection signal.

16. The method of claim 15, wherein the step of adjusting the delay time of at least one adjustable delay line in the plurality of adjustable delay lines further comprises:
- modulating a digital baseband data to generate the plurality of digital input signals according to an oscillating signal; and
- generating a valid signal by determining a digital signal pattern of the digital baseband data;

wherein if the digital signal pattern of the digital baseband data matches a predetermined digital pattern, generating the valid signal to detect the first signal edge and the second signal edge.

17. The method of claim 14, wherein the step of adjusting the delay time of at least one adjustable delay line in the plurality of adjustable delay lines comprises:
- using a plurality of edge detecting circuits to couple to the plurality of adjustable delay lines, each edge detecting circuit is coupled between two consecutive adjustable delay lines in the plurality of adjustable delay lines for generating a determination signal to determine if a first signal edge of a first delayed digital input signal outputted by a first adjustable delay line in the two consecutive adjustable delay lines is aligned with a second signal edge of a second delayed digital input signal outputted by a second adjustable delay line in the two consecutive adjustable delay lines; and
- one-by-one adjusting the plurality of delay times of the plurality of adjustable delay lines according to the plurality of determination signals generated by the plurality of edge detecting circuits respectively.

18. The method of claim 17, wherein the step of adjusting the delay time of at least one adjustable delay line in the plurality of adjustable delay lines further comprises:
- modulating a digital baseband data to generate the plurality of digital input signals according to an oscillating signal; and
- generating a valid signal by determining a digital signal pattern of the digital baseband data;

wherein if the digital signal pattern of the digital baseband data matches a predetermined digital pattern, generating the valid signal to one-by-one enable the plurality of edge detecting circuits.

19. The method of claim 14, wherein the step of adjusting the delay time of at least one adjustable delay line in the plurality of adjustable delay lines comprises:
- detecting a phase difference between a first converting signal and a second converting signal in the plurality of converting signals, wherein the first converting signal corresponds to a first delayed digital input signal in the plurality of delayed digital input signals, the first delayed digital input signal is outputted by a first adjustable delay line in the plurality of adjustable delay lines, the second converting signal corresponds to a second delayed digital input signal in the plurality of delayed digital input signals, and the second delayed digital input signal is outputted by a second adjustable delay line in the plurality of adjustable delay lines; and
- adjusting at least one of a first delay time of the first adjustable delay line and a second delay time of the second adjustable delay line.

20. The method of claim 14, wherein the step of adjusting the delay time of at least one adjustable delay line in the plurality of adjustable delay lines comprises:
- detecting a phase difference between a first converting signal in the plurality of converting signals and a second converting signal, wherein the first converting signal corresponds to a first delayed digital input signal in the plurality of delayed digital input signals, the first delayed digital input signal is outputted by a first adjustable delay line in the plurality of adjustable delay lines, the second converting signal is a combination signal of the plurality of converting signals; and
- adjusting a first delay time of the first adjustable delay line to substantially cancel the phase difference between the first converting signal and the second converting signal.

21. The method of claim 20, wherein a power of the first converting signal substantially equals a power of the second converting signal.

* * * * *